United States Patent
Yoshida

(10) Patent No.: US 7,554,291 B2
(45) Date of Patent: Jun. 30, 2009

(54) BATTERY CONTROL SYSTEM FOR A CHARGEABLE-AND-DISCHARGEABLE POWER SUPPLY SYSTEM

(75) Inventor: Shinsuke Yoshida, Kanagawa (JP)

(73) Assignee: Nissan Motor Co., Ltd., Yokohama-shi (JP)

(*) Notice: Subject to any disclaimer, the term of this patent is extended or adjusted under 35 U.S.C. 154(b) by 307 days.

(21) Appl. No.: 11/448,040

(22) Filed: Jun. 7, 2006

(65) Prior Publication Data

US 2006/0279255 A1 Dec. 14, 2006

(30) Foreign Application Priority Data

Jun. 13, 2005 (JP) ............................. 2005-172445

(51) Int. Cl.
*H02J 7/00* (2006.01)

(52) U.S. Cl. ...................... 320/116; 320/118; 320/119; 320/124; 320/134

(58) Field of Classification Search ................. 320/116, 320/118, 119, 124, 126, 134
See application file for complete search history.

(56) References Cited

U.S. PATENT DOCUMENTS

| | | | | |
|---|---|---|---|---|
| 3,891,959 A | * | 6/1975 | Tsuji et al. ................... | 714/786 |
| 5,493,197 A | * | 2/1996 | Eguchi et al. ............... | 320/116 |
| 5,631,534 A | * | 5/1997 | Lewis ......................... | 320/103 |
| 5,965,996 A | * | 10/1999 | Arledge et al. .............. | 320/116 |
| 6,020,718 A | * | 2/2000 | Ozawa et al. ................ | 320/116 |
| 6,072,300 A | * | 6/2000 | Tsuji .......................... | 320/116 |
| 2001/0011881 A1 | * | 8/2001 | Emori et al. ................ | 320/116 |
| 2003/0044689 A1 | * | 3/2003 | Miyazaki et al. ............ | 429/320 |
| 2003/0151465 A1 | * | 8/2003 | Wood ................... | 331/107 SL |
| 2005/0057219 A1 | * | 3/2005 | Kaminski et al. ........... | 320/116 |
| 2006/0082343 A1 | * | 4/2006 | Sobue et al. ................ | 320/119 |
| 2006/0132139 A1 | * | 6/2006 | Ohta et al. .................. | 324/426 |

FOREIGN PATENT DOCUMENTS

| JP | 8-339829 | 12/1996 |
|---|---|---|
| JP | 3545367 | 4/2004 |

* cited by examiner

*Primary Examiner*—Akm E Ullah
*Assistant Examiner*—Arun Williams
(74) *Attorney, Agent, or Firm*—Foley & Lardner LLP

(57) ABSTRACT

In a chargeable-and-dischargeable power supply system, a plurality of battery cell sections are connected in series with one another, a plurality of cell state detecting sections are installed for the respective battery cell sections and configured to detect a charge state in the respectively corresponding battery cell sections, a power control section is configured to carry out a power supply control for the battery cell sections, a first electrical isolation section is installed in a first signal route from the power control section to one of the cell state detecting sections which is for a highest potential positioned battery cell section, and a second electrical isolation section is installed in a second signal route from one of the cell state detecting sections which is for a lowest potential positioned battery cell section to the power control section.

11 Claims, 7 Drawing Sheets

FIG.3

THE STATE DETECTION SIGNAL IS A RECTANGULAR PULSE.
THE CELL STATE DETECTION SIGNAL IS, DURING A NORMAL STATE,
AN OPPOSITE PHASE RECTANGULAR PULSE TO THE STATE DETECTION
SIGNAL AND, DURING AN ABNORMAL STATE, IS THE SAME PHASE
AS THE STATE DETECTION SIGNAL, RETAINED AT LOW LEVEL
(LOW HOLD), AND RETAINED AT HIGH LEVEL (HIGH HOLD).

IN THE CASE OF A PRESENCE OF ABNORMALITY, SINCE
THE RECTANGULAR WAVE IS THE OPPOSITE PHASE OR
IS NOT OUTPUTTED TO THE SUBSEQUENT STAGE
CELL DETECTING SECTION, THE SIGNAL TO THE BATTERY CONTROL
SECTION IS THE OPPOSITE PHASE OR IS NOT OUTPUTTED
AND THE DETERMINATION OF CELL STATE IS CARRIED OUT.

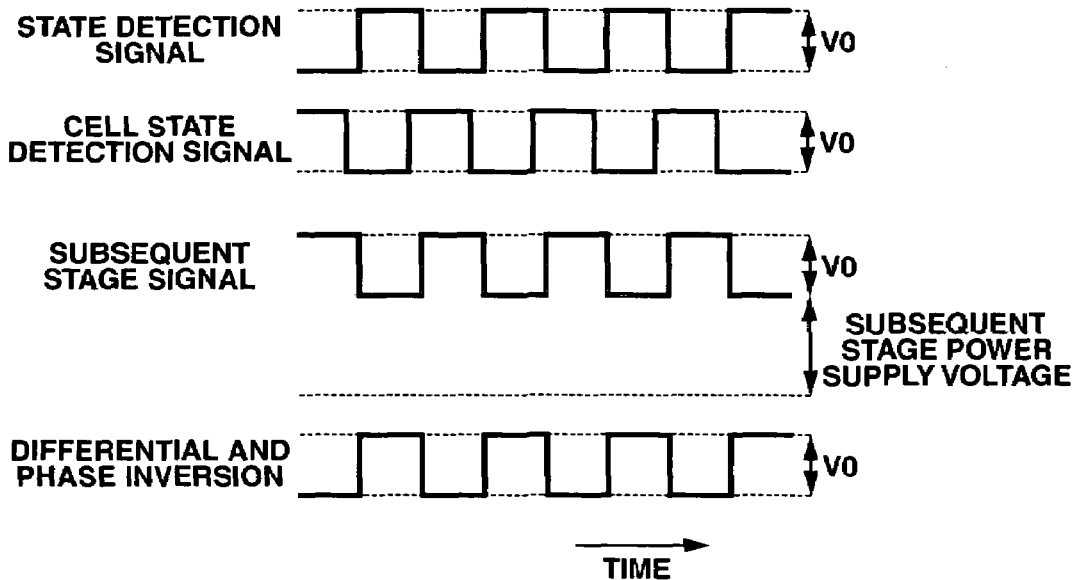

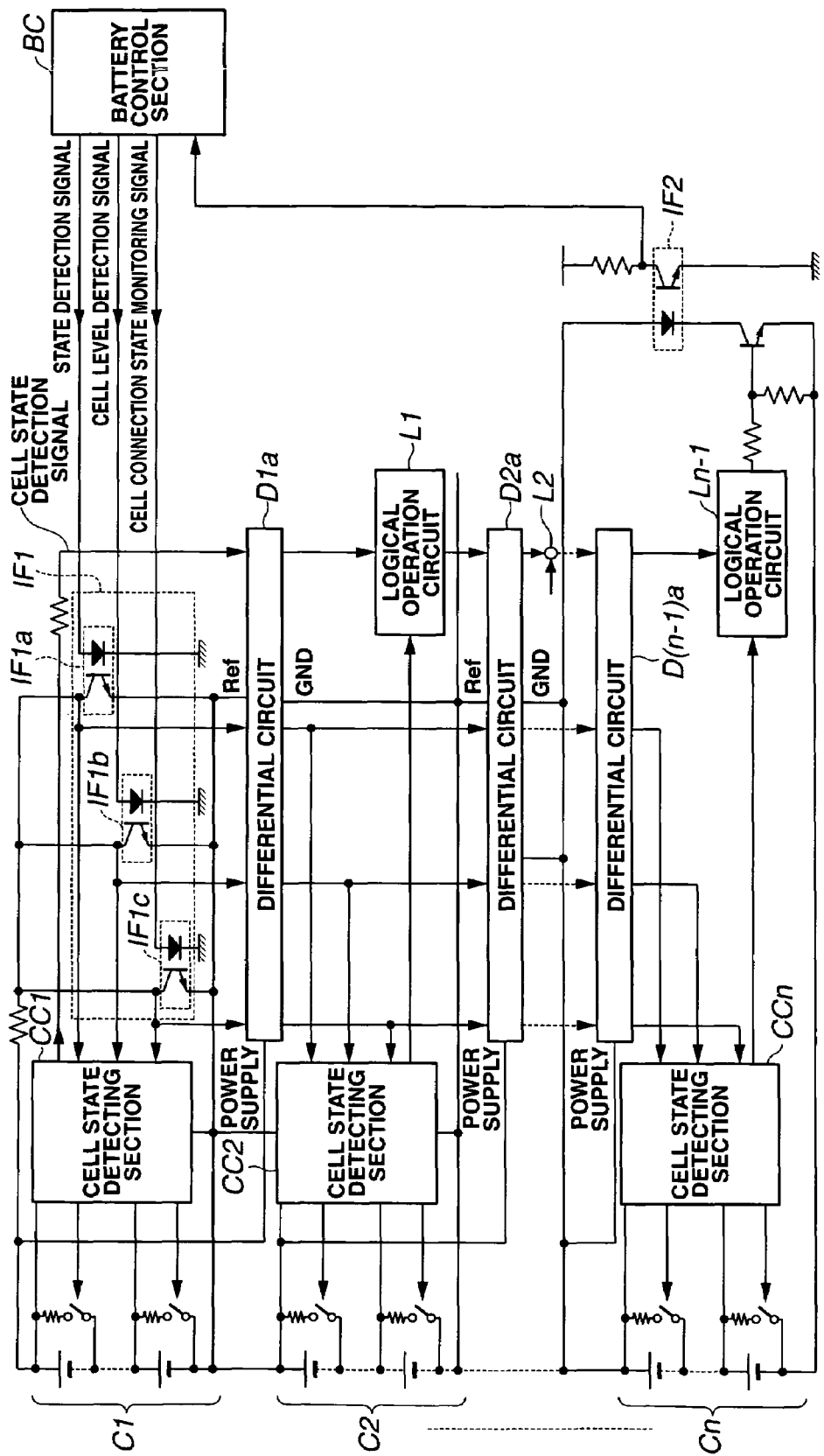

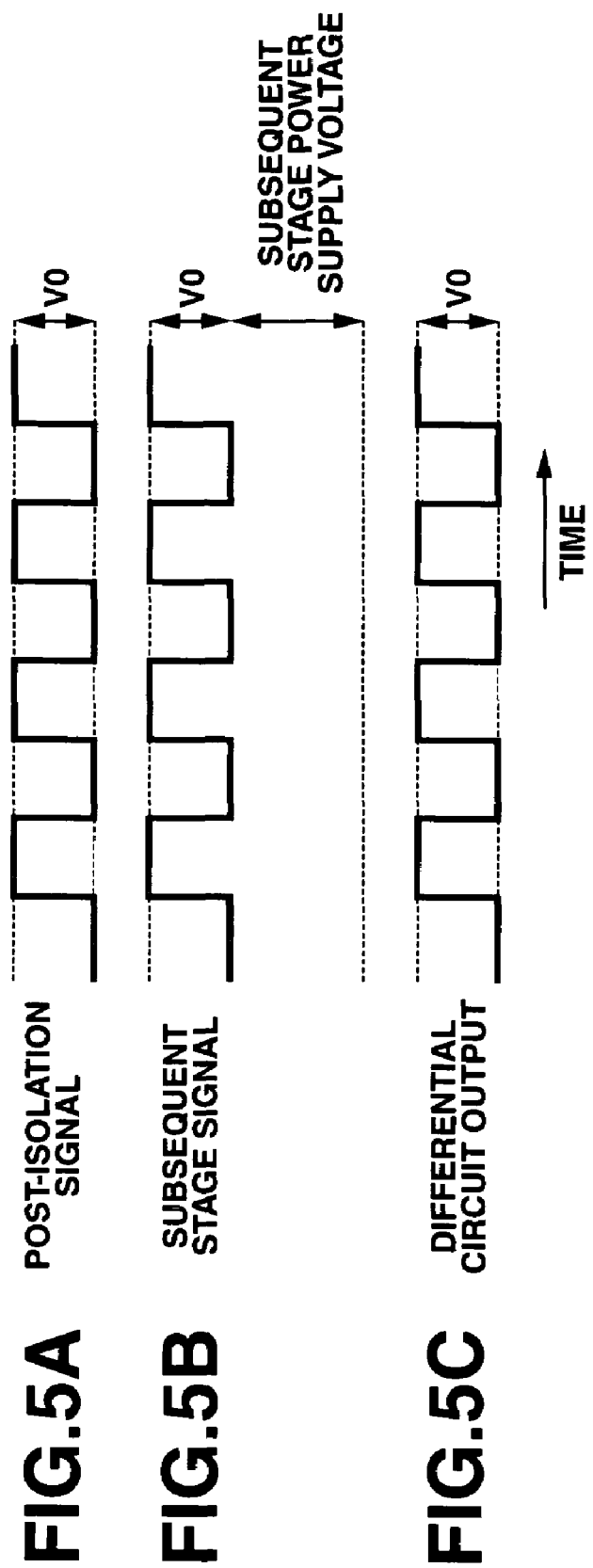

DIFFERENTIAL CIRCUIT

BATTERY CONTROL SYSTEM FOR A CHARGEABLE-AND-DISCHARGEABLE POWER SUPPLY SYSTEM

BACKGROUND OF THE INVENTION (a) Field of the Invention

The present invention relates to a chargeable-and-dischargeable power supply system and, more particularly, relates to the power supply system controlling an electrical power of the power supply system constituted by a plurality of battery cell sections connected in series with one another (in a multiplex connection form) and having a function to detect (charge) states of charging sections (for example, secondary cells) of the respective battery cell sections.

(b) Description of the Related Art

In an electric vehicle which travels using an electric motor, a hybrid vehicle (hereinafter, also referred to as an HEV vehicle) which travels using both of an engine and the electric motor, or a fuel cell automotive vehicle, a secondary cell such as a Ni-MH (Nickel Metal Hydride) battery or Lithium battery is a unit cell and a battery cell group in which a plurality of unit cells are connected in a multiplex connection form or a large-capacity capacitor is used for the power supply of the electric motor. The battery cell group or the large-capacity capacitor is used for the power supply of the electric motor. The battery cell group or the large-capacity capacitor serves to supply an electric power (namely, to discharge) to the electric motor or other systems at a time of a vehicular start, during a traveling, and during a start for a vehicular stop and serves to store or charge using a regeneration action of the electric motor. It is known that the battery cell group discharges the electric power by a large amount of power or if the battery cell group charges the electric power by the large amount of power, voltages between the respective cells or remaining capacities (charge quantities) therebetween are different from the respective battery cells. Hence, an excessive charge or excessive discharge state often occurs. If such an excessive charge state or excessive discharge state occurs, an unfavorable state occurs such as a liquid leakage, an abnormal heat generation, or a shortening of a cell life. Hence, it is necessary to establish a technique to detect voltages of the unit cells of the battery cell group with a high accuracy and in safety. To achieve this technique, input and output controls of the power of the battery cell group or the capacitor and a protection function (excessive charge protection or excessive discharge protection) are carried out.

Ordinarily, cell state detection and protection sections to detect the states of the unit cells of the battery cell group or the state of the capacitor (hereinafter, CC sections) perform controls and detections using the battery cell group power supply or capacitor (large power side) power supply. A section (hereinafter, also called a BC section) which performs the input-and-output controls of the power of the battery cell group or the capacitor and the protection of the battery cell group or the capacitor performs the input-and-output control and the protection using an on-board battery ordinarily mounted in the vehicle (a battery of 12 volts). Therefore, the power supply is different between that for the CC sections and that for the BC section. To perform the information (signal) transmission or reception between the CC sections and the BC section, a communication is carried out with an electrical isolation provided. This is described in a Japanese Patent Application First Publication (tokkai) No. Heisei 8-339829 (title: a monitor device for the battery cell group) published on Dec. 24, 1996 and a Japanese Patent No. 3545367 issued on Apr. 16, 2004 (title: voltage detection apparatus for the battery cell group).

SUMMARY OF THE INVENTION

However, in each of the above-described previously proposed monitoring and detection apparatuses, each CC section monitors the plurality of unit cells. Then, in order to perform the signal transmission and reception between the plurality of CC sections and the BC section, electrical isolation device (element) circuits (hereinafter, also called isolation device (element) circuits) having the same number as the CC sections or having the same number as signal lines of the CC sections to perform the communication with the BC section are required. Thus, the whole control circuit becomes expensive and a scale of the whole control circuit becomes large. In addition, each isolation element (device) circuit consumes a large power to drive and it is difficult to make a lower power consumption for each isolation element (device) circuit. Furthermore, an isolation element (device) of each isolation element (device) circuit has a relatively low durability against a high temperature. In a case where a multiple number of the isolation elements are used, a heat generation due to a bypass of each cell, the heat generation of CPU (Central Processing Unit), and an external air temperature are required to be taken into consideration. A spatial limitation is developed in an arrangement within the whole control circuit.

It is, therefore, an object of the present invention to provide an improved chargeable-and-dischargeable power supply system which can solve the above-described inconveniences, namely, can reduce the number of the electrical isolation element (device) circuits as little as possible, with a reduced manufacturing cost and a circuit miniaturization achieved.

To achieve the above-described object, according to one aspect of the present invention, there is provided with a chargeable-and-dischargeable power supply system, comprising: a plurality of battery cell sections connected in series with one another, each battery cell section being constituted by at least one charging section; a plurality of cell state detecting sections installed for the respective battery cell sections and configured to detect a charge state of the charging section of the respectively corresponding battery cell sections; a power control section configured to carry out a power supply control for the battery cell sections; a first electrical isolation section installed in a first signal route from the power control section to one of the cell state detecting sections which is for a highest potential positioned battery cell section of the battery cell sections; and a second electrical isolation section installed in a second signal route from one of the cell state detecting sections which is for a lowest potential positioned battery cell section of the battery cell sections to the power control section.

In the chargeable-and-dischargeable power supply system according to the present invention, the number of the isolation element circuits can be reduced, the manufacturing cost can be reduced, and the circuit miniaturization can be achieved. In addition, previously proposed cell state detection functions, power control, and protection functions can be achieved and, furthermore, a power consumption can be reduced.

This summary of the invention does not necessarily describe all necessary features so that the present invention may also be a sub-combination of these described features.

BRIEF DESCRIPTION OF THE DRAWINGS

FIG. 3 is integrally a timing chart representing one example of each signal in the chargeable-and-dischargeable power supply system shown in FIG. 2.

FIG. 4 is a schematic circuit block of the chargeable-and-dischargeable power supply system in a second preferred embodiment according to the present invention.

FIGS. 5A, 5B, and 5C are integrally a timing chart representing one example of each signal in the chargeable-and-dischargeable power supply system shown in FIG. 4.

DETAILED DESCRIPTION OF THE INVENTION

Reference will hereinafter be made to the drawings in order to facilitate a better understanding of the present invention.

Figure 1A:
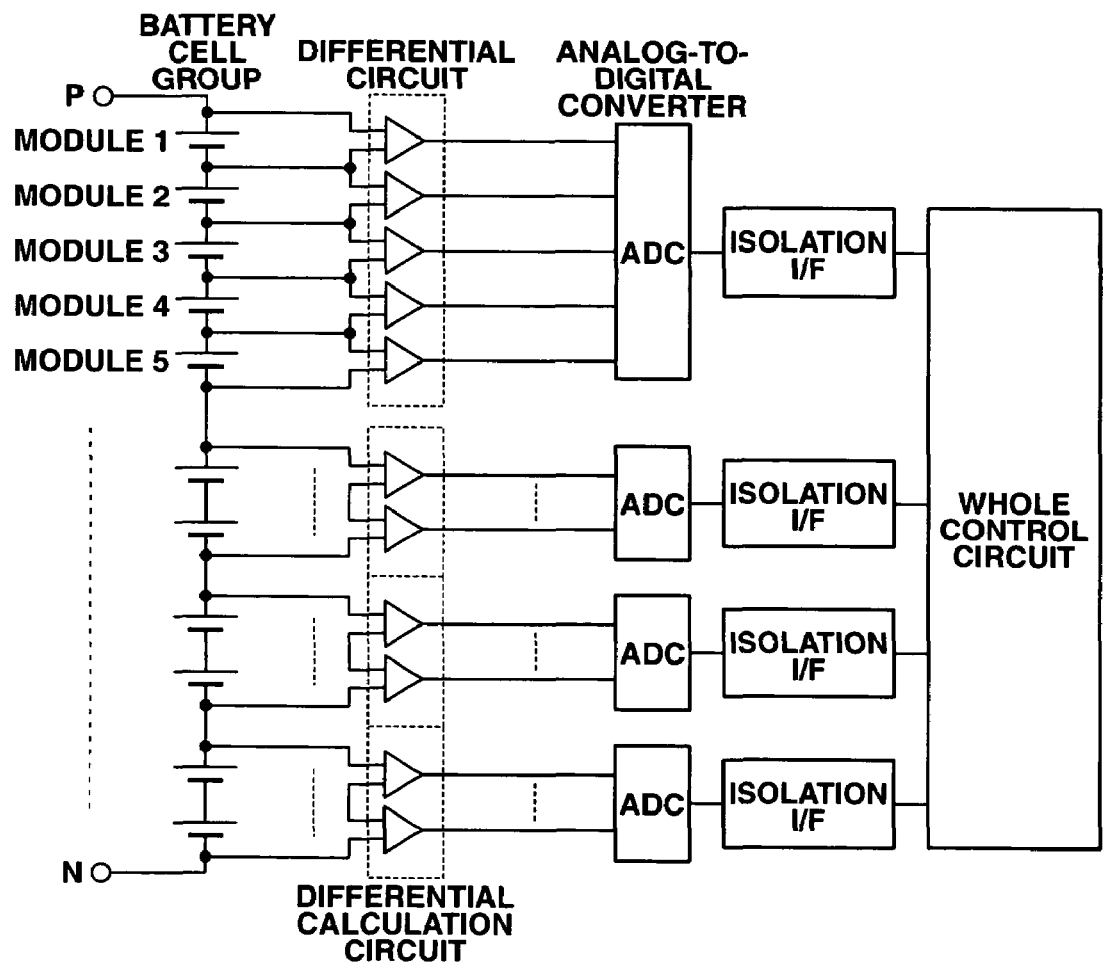
FIGS. 1A and 1B show schematic circuit block diagrams of comparative examples to a chargeable-and-dischargeable power supply system according to the present invention.
Figure 1B:
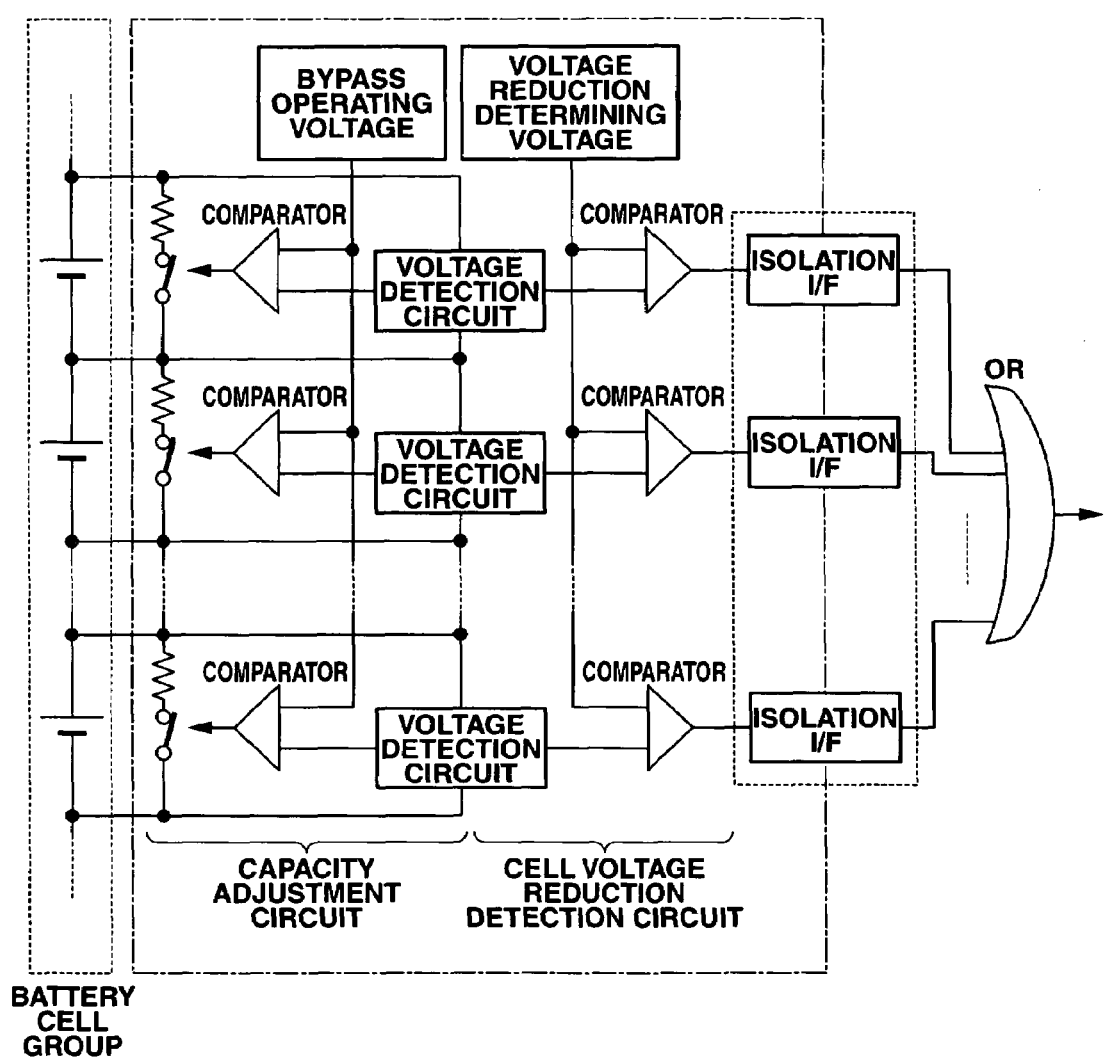

Before explaining the present invention, FIGS. 1A and 1B show a circuit block diagram of comparative examples to be compared with a chargeable-and-dischargeable power supply system according to the present invention. As shown in FIGS. 1A and 1B, isolation interface circuits (or isolation I/Fs) (constituted by the electrical isolation element (device) circuits) having the same number as unit cells (unit secondary cells) are required for respective unit cells constituting respective modules of a battery cell group or for respective capacity adjustment circuits or respective cell voltage reduction detection circuits. In FIG. 1A, each module is constituted by at least one or more of unit cells, each triangle shaped symbol denotes a differential circuit, and ADC denotes an analog-to-digital converter. It will be appreciated from FIGS. 1A and FIG. 1B, the isolation I/Fs having the same number as the unit cells are required for predetermined modules of the battery cell group (refer to FIG. 1A) and for the respective capacity adjustment circuits and for the cell voltage reduction detection circuits (refer to FIG. 1B).

FIRST EMBODIMENT

Figure 2:
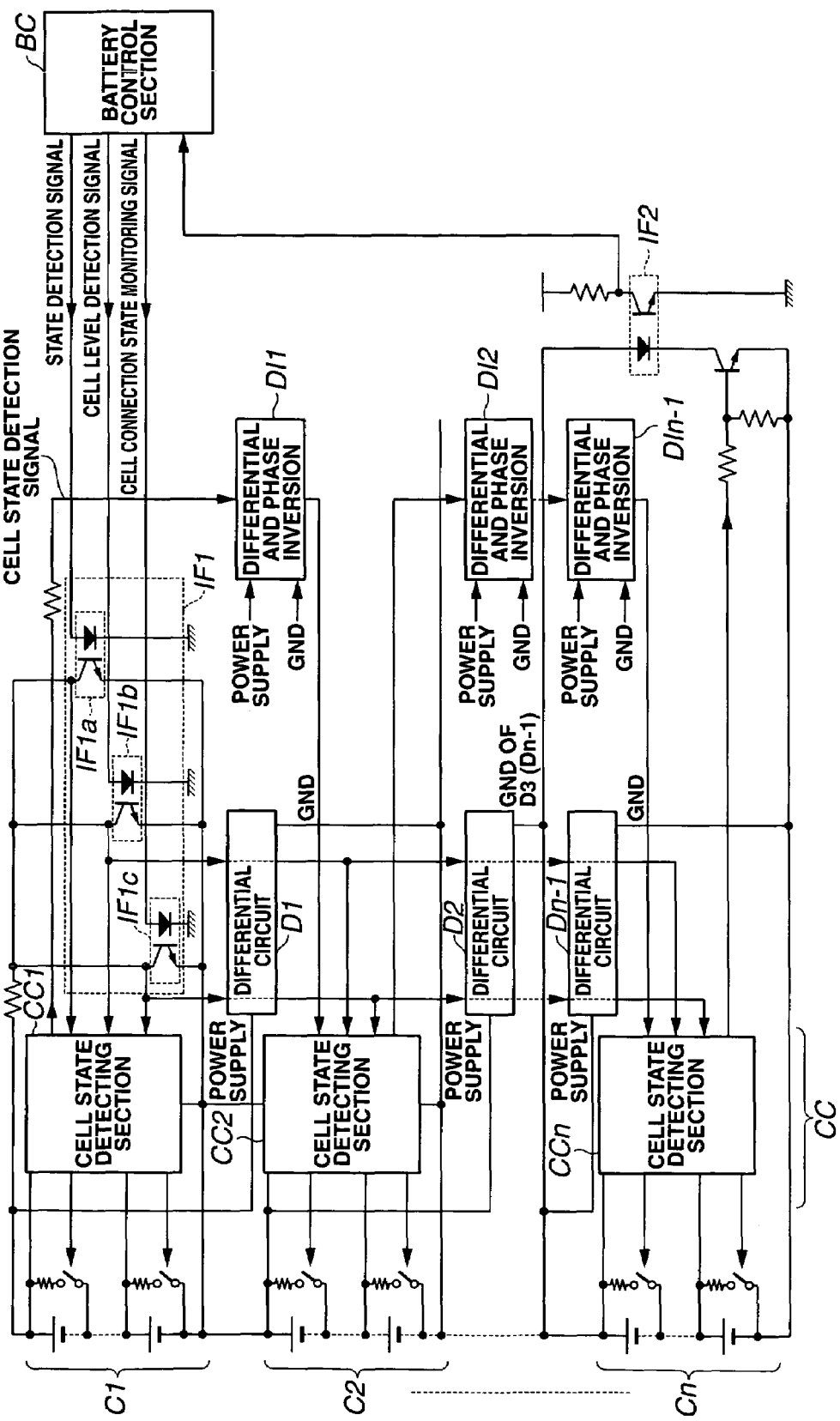
FIG. 2 is a circuit block diagram of the chargeable-and-dischargeable power supply system in a first preferred embodiment according to the present invention.

Next, the chargeable-and-dischargeable power supply system according present invention will be described with reference to FIGS. 2 through 6. FIG. 2 shows a basic structure (a first preferred embodiment) of the chargeable-and-dischargeable power supply system according to the present invention. As shown in FIG. 2, the power supply system in the first embodiment according to the present invention includes: an n (n: natural number and 1, 2, 3, - - - , n) number of serially connected battery cell sections (C1, C2, C3, - - - , Cn), each battery cell section (namely, each module) including a plurality of DC power supplies (in the first embodiment, including at least one or more of the unit cells); and an n number of cell state detecting sections (hereinafter also called, CC sections (CC1, CC2, - - - , CCn)) to check and monitor a charged state of each of the DC power supplies (viz., each of charging sections (unit cells)) for a corresponding one of battery cell sections C1, C2, C3, - - - , Cn.

It is noted that each cell state detecting section CC1, CC2, - - - , CCn includes, the cell voltage reduction detection circuit and the capacity adjustment circuit. As shown in a circuit block diagram of FIG. 1B, a circuit enclosed by a dot-and-dash line of FIG. 1B except each isolation I/F and an OR gate generally denotes each of cell state detecting sections CC1, CC2, - - - , CCn. It will be appreciated from FIG. 1B that a voltage detection circuit is installed for each unit cell, as voltage supplies of a bypass operating voltage and a plurality of comparators for each cell state detecting section CC1, CC2, - - - , CCn, a potential difference between a highest potential positioned voltage of the corresponding one of the cell state detecting sections CC1, CC2, - - - , CCn and a lowest potential positioned voltage thereof is used, and an output signal of the OR gate is supplied to a second differential circuit DI1, DI2, - - - , DIn-1 as will be described later. In addition, the chargeable-and-dischargeable power supply system includes: a battery control section (hereinafter also referred to as a BC section and ordinarily constituted by a microcomputer) to perform a power control for the whole battery cell sections C1, C2, - - - , Cn via the cell state detecting sections (CC sections); a first electrical isolation section (isolation element (device) circuit) IF1 (IF1a, IF1b, and IF1c) installed in a first communication signal route from the BC station to one of the cell state detecting sections (CC sections) which is (used) for a higher potential positioned battery cell section (namely, C1); and a second electrical isolation section IF2 installed in a second communication signal route from another of the cell state detecting sections which is (used) for a lowest potential positioned battery cell section (namely, Cn) to the BC section. Respective electrical isolation sections IF1, IF2 have functions to match a power supply potential of the BC section with that of each of the cell state detecting sections CC1 and CCn for the highest and lowest potential positioned battery cell sections (CC sections). It is noted that each of first and second electrical isolation sections (isolation element (device) circuit) may be constituted by an opto-isolator (or photo-coupler as shown in FIG. 2) or an insulating transformer type isolator.

Furthermore, the power supply system in the first embodiment shown in FIG. 2 includes: (n-1) number of first differential circuits D1, D2, - - - , Dn-1 between mutually adjacent two of the CC sections; and (n-1) number of differential and phase inversion circuits (second differential circuits) DI1, DI2, - - - , DIn-1 therebetween. In this embodiment, a top (uppermost) stage first differential circuit D1 receives a cell level detection signal outputted from the BC section BC via corresponding first isolation element (device) circuit IF1b and a cell connection state monitoring signal outputted from the BC section BC via isolation element (device) circuit IF1c, offsets (corrects) these signals by a potential difference between the respectively adjacent highest potential positioned and the next highest (lower potential positioned) potential positioned battery cell sections C1 and C2, and supplies each of the corrected signals which matches with the potential of the next highest potential positioned (lower potential positioned) battery cell section (namely, C2) to the subsequent stage cell state detecting section CC2. Each of the subsequent stage first differential circuits D2, D3, - - - , Dn-1 performs the same operation as described above. In addition, an uppermost differential and phase inversion circuit (uppermost second differential circuit) DI1 receives the cell state detection signal outputted from CC1, offsets (corrects) the received signal by the potential difference between the highest potential positioned battery cell section C1 and the adjacent lower potential positioned battery cell section C2 to match with the potential of the adjacent lower potential positioned cell state detecting section CC2, performs a phase inversion, and supplies a signal converted to the cell state detection signal (subsequent stage signal) to the subsequent stage cell state detecting section CC2. FIG. 3 shows integrally one example of each signal in the chargeable-and-dischargeable power supply system shown in FIG. 2. By performing a signal processing as shown in FIG. 3, the check and monitoring of the cell states according to the corrected signals by the respective electrical signals of the respective CC sections.

SECOND EMBODIMENT

FIG. 4 shows a schematic block diagram representing a basic structure of the chargeable-and-dischargeable power supply system in a second preferred embodiment according to the present invention. The chargeable-and-dischargeable power supply system in the second embodiment has generally the same structure as described in the first embodiment shown in FIG. 2 and, hence, only a difference point will herein be described.

The chargeable-and-dischargeable power supply system in the second embodiment includes: (n-1) number of third differential circuits D1a, D2a, - - -, D(n-1)a interposed between each cell state detecting section CC1, CC2, CCn; and (n-1) number of logical operation circuits L1, L2, L(n-1) to perform logical operations between one of the signals outputted from the preceding stage CC section and which has undergone the offset (potential correction) by means of the same stage differential circuit and the signal outputted from the subsequent stage CC section which is adjacent to the corresponding one of the logical operation circuits. In this embodiment, the uppermost stage third differential circuits D1a, serves to offset (correct) all of four signals supplied as the cell state detection signal from one of the cell state detecting sections CC1 which is for the highest potential positioned battery cell section C1, the state detection signal via the first isolation element circuit IF1a, the cell level detection signal via the first isolation element circuit IF1b, and cell connection state monitoring signal via the first isolation element (device) circuit IF1c by means of the potential difference between the highest potential of the corresponding one of the cell state detecting section CC1 and lowest potential of the corresponding one of the cell state detecting sections CC1. For the subsequent stage third differential circuit D2a, - - -, D(n-1)a, all of the four signals passed through the preceding stage third differential circuit (and preceding stage logical operation circuit L1, L2, - - -, Ln-1) are offset by means of the potential difference between the adjacent two battery cell sections.

Figure 6:
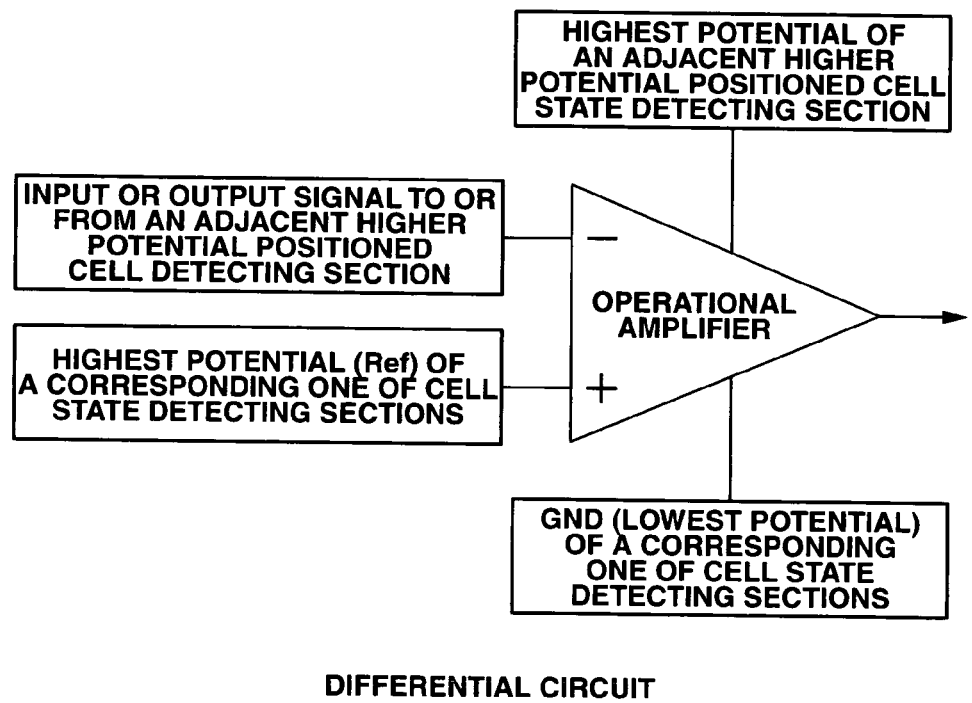
FIG. 6 is a connection diagram of each of a third differential circuit shown in FIG. 4.

FIGS. 5A, 5B, and 5C integrally show a timing chart of one example of each signal in the chargeable-and-dischargeable power supply system shown in FIG. 4. By performing the signal processing, the check and monitoring of the cell state of each unit cell and the control and monitoring of the CC sections are carried out. FIG. 6 shows a circuit block diagram of a representative third differential circuit (for example, D1a) shown in FIG. 4. As shown in FIG. 6, an operating power supply (so-called, a bias supply) of an operational amplifier constituting the representative third differential circuit (D1a, D2a, - - -, D(n-1)a) is between a highest potential of the uppermost cell state detecting section CC1 and a lowest potential (GND) of the adjacent lower potential side cell state detecting section CC2. In addition, inputs of the operational amplifier are the input or output signal to or from the highest potential of the adjacent higher potential positioned cell state detecting sections CC1, CC2, - - -, CCn (negative input end (inverting input end)) and the highest potential (Ref) of the corresponding one of the cell state detecting sections CC2, CC(n-1), as shown in FIG. 6. Thus, the potential of the signal to be transmitted to the subsequent stage of the cell state detecting section can be aligned.

As described above, the signals from the BC section (BC) to one of the CC sections which is for the highest potential positioned battery cell section are passed through the first isolation element (device) circuit IF1 (IF1a, IF1b, IF1c) and the signal from one of the CC sections which is for the lowest potential positioned battery cell section to the BC section BC is passed through the second isolation element (device) circuit IF2, as shown in FIGS. 2 and 4. Thus, it is not necessary to provide the isolation element (device) circuits for the signals from the BC section BC to the respective cell state detecting sections (CC sections) CC1, CC2, - - -, CCn and the isolation element (device) circuits for the signals from the respective cell state detecting sections (CC sections) CC1, CC2, - - -, CCn to the BC section BC. A total manufacturing cost reduction of the chargeable-and-dischargeable power supply system and a miniaturization of the whole circuitry thereof can be achieved.

In addition, in order to match potentials of signals from the battery control section BC to the corresponding cell state detecting sections (CC sections), as shown in FIG. 2, use of each differential circuit permits the electric potential corresponding to the DC potential difference between the higher potential positioned CC section and the lower potential positioned CC section to be the signal to be inputted to each CC section. The output signals from the CC sections match the potentials of lower potential positioned CC sections through the use of differential circuits (typically refer to FIG. 6) with the low potential positioned CC section. By means of the logical operation, it becomes possible to output the signal to the BC section via the isolation element (device) circuit at the lowest potential positioned CC section. Thus, the manufacturing cost reduction and circuit miniaturization can be achieved.

In addition, the outputs of the respective cell state detecting sections CC1, CC2, - - -, CCn are inputted to the lower potential positioned CC sections by the signals whose potentials are matched with the respectively corresponding differential circuits so that the above-described differential and phase inversion as the second differential circuit can be eliminated as shown in FIG. 4. Thus, a further manufacturing cost reduction and a further circuit miniaturization can be achieved. Furthermore, in the second embodiment shown in FIG. 4, in a case where the output signal from each higher potential positioned CC section is supplied to the adjacent lower potential CC section, if the signal from the BC section to the corresponding one of the CC sections is the same signal as the signal outputted from the corresponding one of the CC sections when the corresponding one of the battery cell sections is normally operated, a determination of whether each of the battery cell sections C1, C2, - - -, Cn has failed or not can be made. It is noted that the operational amplifier shown in FIG. 6 is applicable to each of first differential circuits D1, D2, - - -, Dn-1 in the first embodiment. It is also noted that each battery cell section C1, C2, - - -, Cn includes at least one charging section (for example, the secondary cell or a capacitor), V0 shown in FIGS. 3 and 5A through 5C denotes a voltage of the power supply to each comparator in the respective cell state detecting sections CC1, CC2, - - -, CCn, each voltage value of the voltage reduction determining voltage and the bypass operating voltage in each cell state detecting section CC1, CC2, - - -, CCn is predetermined on the basis of the terminal voltage across a representative one of the unit cells when fully charged, and the third differential circuits may include corresponding logical operation circuits L1, L2, Ln-1. In FIG. 4, each logical operation circuit L1, L2, - - -, Ln-1 is, for example, constituted by a logical OR circuit.

This application is based on a prior Japanese Patent Application No. 2005-172445 filed in Japan on Jun. 13, 2005, the disclosures of which are hereby incorporated by reference. Various modifications and variations can be made without departing from the scope and the sprit of the present invention.

What is claimed is:

1. A chargeable-and-dischargeable power supply system, comprising:
    a plurality of battery cell sections connected in series with one another, each battery cell section being constituted by at least one charging section;
    a plurality of cell state detecting sections installed for the respective battery cell sections and configured to detect a charge state of the charging section of the respectively corresponding battery cell sections;
    a power control section configured to carry out a power supply control for the battery cell sections;
    a first electrical isolation section installed in a first signal route from the power control section to one of the cell state detecting sections which is for a highest potential positioned battery cell section of the battery cell sections;
    a second electrical isolation section installed in a second signal route from one of the cell state detecting sections which is for a lowest potential positioned battery cell section of the battery cell sections to the power control section;
    a plurality of first differential circuits, each of the first differential circuits being installed in a third signal route between mutually adjacent two of the cell state detecting sections which is for a higher potential positioned battery cell section and which is for a lower potential positioned battery cell section, an uppermost stage first differential circuit thereof supplying signals which are to be inputted to one of the cell state detecting sections which is for the highest potential positioned battery cell section via the first electrical isolation section and which are offset by a DC voltage corresponding to an electrical potential difference between mutually adjacent two highest potential positioned battery cell section and second highest potential positioned battery cell section in a form of signals from the power control section to one of the cell state detecting sections which is for the next highest potential positioned battery cell section and each of the subsequent stage first differential circuits supplying signals which are to be inputted to one of the cell state detecting sections except for the highest potential positioned battery cell section from the power control section via its preceding stage first differential circuit and which are offset by the DC voltage corresponding to the electrical potential difference between the adjacent two of the cell state detecting sections which is for the higher potential positioned battery cell section and which is for the lower potential positioned battery cell section in the form of signals from the power control section to one of the cell state detecting sections which is for the lower potential positioned battery cell section; and
    a plurality of second differential circuits, each of the second differential circuits being installed in a fourth signal route between one of the cell state detecting sections which is for the higher potential positioned battery cell section and its adjacent cell state detecting section which is for the lower potential positioned battery cell section and being configured to perform a logical operation between a signal outputted from one of the cell state detecting sections which is for the higher potential positioned battery cell section of the battery cell sections and a signal outputted from another of the cell state detecting sections which is adjacent to the cell state detecting section for the higher potential positioned battery cell section and which is for the lower potential positioned battery cell section and configured to offset the signal outputted from the one of the cell state detecting sections which is for the higher potential positioned battery cell section by a DC voltage corresponding to a potential difference between one of the cell state detecting sections which is for the higher potential positioned battery cell section and the adjacent cell state detecting section which is for the lower potential positioned battery cell section to supply each of the signals from the cell state detecting sections to the power control section, and
    wherein each of the differential circuits is interposed between the mutually adjoining cell state detecting sections in a structure wherein any one or more of the cell state detecting sections which is directly connected to the power control section via an isolation section and any one or more of the remaining cell state detecting sections which is directly or indirectly connected to one of the cell state detecting sections which is positioned at the highest potential or positioned at the lowest potential and connected to the power control section via one of the other cell state detecting sections which is positioned at the highest potential or the lowest potential.

2. The chargeable-and-dischargeable power supply system as claimed in claim 1, wherein the chargeable-and-dischargeable power supply system further comprises a plurality of third differential circuits, each of the third differential circuits being installed in the third signal route between one of the cell state detecting sections which is for a higher potential positioned battery cell section and its adjacent cell state detecting section which is for a lower potential positioned battery cell section, an uppermost stage third differential circuit thereof being configured to supply signals which are to be inputted to one of the cell state detecting sections which is for the highest potential positioned battery cell section from the power control section via the first electrical isolation section and, furthermore, configured to offset the signals outputted from one of the cell state detecting sections which is for the highest potential positioned battery cell section by a DC voltage corresponding to an electrical potential difference between mutually adjacent two of the cell state detecting sections which is for the highest potential positioned battery cell section and which is for the next highest battery cell section to supply the offset signals to the subsequent stage third differential circuit and each of the subsequent stage third differential circuits being configured to supply signals to be inputted to one of the cell state detecting sections expect for the highest potential positioned battery cell section from the power control section via its preceding stage third differential circuit and configured to offset the signals outputted from one of the cell state detecting sections which is for the higher potential positioned battery cell section by a DC voltage corresponding to an electrical potential difference between the higher potential positioned battery cell section and the lower potential positioned battery cell section to perform a logical operation between a signal outputted from one of the cell state detecting sections which is for the higher potential positioned battery cell section and a signal outputted from another of the cell state detecting sections which is for the lower potential positioned battery cell section to supply the offset signals to the subsequent stage third differential circuit.

3. The chargeable-and-dischargeable power supply system as claimed in claim 2, wherein each of the cell state detecting sections outputs the same as a signal supplied from the power control section when determining that a corresponding one of the battery cell sections is normally charged.

4. The chargeable-and-dischargeable power supply system as claimed in claim 2, wherein the number of the third differential circuits is reduced by one with respect to the number of the battery cell sections which is at least three.

5. The chargeable-and-dischargeable power supply system as claimed in claim 2, wherein each of the third differential circuit comprises at least one of an operational amplifier having a positive power supply terminal connected to a highest potential of an adjacent higher potential positioned cell state detecting section and a minus power supply terminal connected to a lowest potential (GND) of a corresponding one of the cell state detecting sections and having a non-inverting input terminal connected to a highest potential of the corresponding one of the cell state detecting sections and an inverting input terminal connected to at least one of input and output terminals of the adjacent cell state detecting section which is for the higher potential positioned battery cell section.

6. The chargeable-and-dischargeable power supply system as claimed in claim 1, wherein each of the first and second electrical isolation sections comprises an opto-isolator.

7. The chargeable-and-dischargeable power supply system as claimed in claim 1, wherein each of the battery cell sections is constituted by a plurality of charging sections.

8. The chargeable-and-dischargeable power supply system as claimed in claim 1, wherein each of the second differential circuits comprises a differential-and-phase-inversion circuit.

9. The chargeable-and-dischargeable power supply system as claimed in claim 1, wherein the number of the first differential circuits is reduced by one with respect to the number of the battery cell sections which is at least three.

10. A chargeable-and-dischargeable power supply system, comprising:
  a plurality of battery cell means connected in series with one another, each battery cell means being constituted by at least one charging means;
  a plurality of cell state detecting means installed for the respective battery cell means and for detecting a charge state of the charging means of the respectively corresponding battery cell means;
  power control means for carrying out a power supply control for the battery cell means;
  first electrical isolation means installed in a first signal route from the power control means to one of the cell state detecting means which is for a highest potential positioned battery cell means of the battery cell means;
  second electrical isolation means installed in a second signal route from one of the cell state detecting means which is for a lowest potential positioned battery cell means of the battery cell means to the power control means;
  a plurality of first differential circuits, each of the first differential circuits being installed in a third signal route between mutually adjacent two of the cell state detecting means which is for a higher potential positioned battery cell means and which is for a lower potential positioned battery cell means, an uppermost stage first differential circuit thereof supplying signals which are to be inputted to one of the cell state detecting means which is for the highest potential positioned battery cell means via the first electrical isolation means and which are offset by a DC voltage corresponding to an electrical potential difference between mutually adjacent two highest potential positioned battery cell means and second highest potential positioned battery cell means in a form of signals from the power control means to one of the cell state detecting means which is for the next highest potential positioned battery cell means and each of the subsequent stage first differential circuits supplying signals which are to be inputted to one of the cell state detecting means except for the highest potential positioned battery cell means from the power control means via its preceding stage first differential circuit and which are offset by the DC voltage corresponding to the electrical potential difference between the adjacent two of the cell state detecting means which is for the higher potential positioned battery cell means and which is for the lower potential positioned battery cell means in a form of signals from the power control means to one of the cell state detecting means which is for the lower potential positioned battery cell means; and
  a plurality of second differential circuits, each of the second differential circuits being installed in a fourth signal route between one of the cell state detecting means which is for the higher potential positioned battery cell means and its adjacent cell state detecting means which is for the lower potential positioned battery cell means and being configured to perform a logical operation between a signal outputted from one of the cell state detecting means which is for the higher potential positioned battery cell means of the battery cell means and a signal outputted from another of the cell state detecting means which is adjacent to the cell state detecting means for the higher potential positioned battery cell means and which is for the lower potential positioned battery cell means and configured to offset the signal outputted from the one of the cell state detecting means which is for the higher potential positioned battery cell means by a DC voltage corresponding to a potential difference between one of the cell state detecting means which is for the higher potential positioned battery cell means and the adjacent cell state detecting means which is for the lower potential positioned battery cell means to supply each of the signals from the cell state detecting means to the power control means, and
  wherein each of the differential circuits is interposed between the mutually adjoining cell state detecting means in a structure wherein any one or more of the cell state detecting means which is directly connected to the power control means via an isolation means and any one or more of the remaining cell state detecting means which is directly or indirectly connected to one of the cell state detecting means which is positioned at the highest potential or positioned at the lowest potential and connected to the power control means via one of the other cell state detecting means which is positioned at the highest potential or the lowest potential.

11. A method applicable to a charge-and-dischargeable power supply system, comprising:
  providing a plurality of battery cell sections connected in series with one another, each battery cell section being constituted by at least one charging section;
  providing a plurality of cell state detecting sections installed for the respective battery cell sections and configured to detect a charge state of the charging section of the respectively corresponding battery cell sections;
  providing a power control section configured to carry out a power supply control for the battery cell sections;
  providing a first electrical isolation section installed in a first signal route from the power control section to one of the cell state detecting sections which is for a highest potential positioned battery cell section of the battery cell sections;
  providing a second electrical isolation section installed in a second signal route from one of the cell state detecting sections which is for a lowest potential positioned battery cell section of the battery cell sections to the power control section;

providing a plurality of first differential circuits, each of the first differential circuits being installed in a third signal route between mutually adjacent two of the cell state detecting sections which is for a higher potential positioned battery cell section and which is for a lower potential positioned battery cell section, an uppermost stage first differential circuit thereof supplying signals which are to be inputted to one of the cell state detecting sections which is for the highest potential positioned battery cell section via the first electrical isolation section and which are offset by a DC voltage corresponding to an electrical potential difference between mutually adjacent two highest potential positioned battery cell section and second highest potential positioned battery cell section in a form of signals from the power control section to one of the cell state detecting sections which is for the next highest potential positioned battery cell section and each of the subsequent stage first differential circuits supplying signals which are to be inputted to one of the cell state detecting sections except for the highest potential positioned battery cell section from the power control section via its preceding stage first differential circuit and which are offset by the DC voltage corresponding to the electrical potential difference between the adjacent two of the cell state detecting sections which is for the higher potential positioned battery cell section and which is for the lower potential positioned battery cell section in the form of signals from the power control section to one of the cell state detecting sections which is for the lower potential positioned battery cell section; and providing a plurality of second differential circuits, each of the second differential circuits being installed in a fourth signal route between one of the cell state detecting sections which is for the higher potential positioned battery cell section and its adjacent cell state detecting section which is for the lower potential positioned battery cell section and being configured to perform a logical operation between a signal outputted from one of the cell state detecting sections which is for the higher potential positioned battery cell section of the battey cell sections and a signal outputted from another of the cell state detecting sections which is adjacent to the cell state detecting section for the higher potential positioned battery cell section and which is for the lower potential positioned battery cell section and configured to offset the signal outputted from the one of the cell state detecting sections which is for the higher potential positioned battery cell section by a DC voltage corresponding to a potential difference between one of the cell state detecting sections which is for the higher potential positioned battery cell section and the adjacent cell state detecting section which is for the lower potential positioned battery cell section to supply each of the signals from the cell state detecting sections to the power control section, and wherein each of the differential circuits is interposed between the mutually adjoining cell state detecting sections in a structure wherein any one or more of the cell state detecting sections which is directly connected to the power control section via an isolation section and any one or more of the remaining cell state detecting sections which is directly or indirectly connected to one of the cell state detecting sections which is positioned at the highest potential or positioned at the lowest potential and connected to the power control section via one of the other cell state detecting sections which is positioned at the highest potential or the lowest potential.

* * * * *